United States Patent
Yi et al.

(10) Patent No.: US 9,847,115 B2
(45) Date of Patent: Dec. 19, 2017

(54) ELECTRONIC DEVICE

(71) Applicant: SK hynix Inc., Icheon-Si (KR)

(72) Inventors: Jae-Yun Yi, Icheon-si (KR); Hong-Ju Suh, Icheon-si (KR); Se-Dong Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/341,537

(22) Filed: Nov. 2, 2016

(65) Prior Publication Data

US 2017/0337961 A1 Nov. 23, 2017

(30) Foreign Application Priority Data

May 17, 2016 (KR) ........................ 10-2016-0060289

(51) Int. Cl.
| | |
|---|---|
| *G11C 11/34* | (2006.01) |
| *G11C 11/16* | (2006.01) |
| *G06F 3/06* | (2006.01) |
| *G06F 12/0802* | (2016.01) |
| *G11C 13/00* | (2006.01) |

(52) U.S. Cl.
CPC .......... *G11C 11/1675* (2013.01); *G06F 3/061* (2013.01); *G06F 3/0656* (2013.01); *G06F 3/0673* (2013.01); *G06F 12/0802* (2013.01); *G11C 11/1673* (2013.01); *G11C 13/004* (2013.01); *G11C 13/0004* (2013.01); *G11C 13/0069* (2013.01); *G06F 2212/2024* (2013.01); *G06F 2212/60* (2013.01)

(58) Field of Classification Search
CPC ............... G11C 2207/005; G11C 11/14–11/16

USPC ............ 365/185.11, 158, 171, 173, 148, 163
See application file for complete search history.

(56) References Cited

U.S. PATENT DOCUMENTS

| | | | | |
|---|---|---|---|---|
| 6,262,914 | B1 * | 7/2001 | Smayling | G11C 16/0491 365/185.01 |
| 2011/0096609 | A1 * | 4/2011 | Lee | G11C 16/0425 365/185.28 |
| 2015/0049537 | A1 * | 2/2015 | Sim | H01L 27/2463 365/148 |
| 2016/0064452 | A1 * | 3/2016 | Ueda | H01L 27/228 365/148 |

FOREIGN PATENT DOCUMENTS

| | | |
|---|---|---|
| KR | 10-2009-0126102 A | 12/2009 |
| KR | 10-2010-0123136 A | 11/2010 |
| KR | 10-2014-0107952 A | 9/2014 |

* cited by examiner

*Primary Examiner* — Han Yang
(74) *Attorney, Agent, or Firm* — Perkins Coie LLP

(57) ABSTRACT

An electronic device may include a semiconductor memory. The semiconductor memory may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix.

15 Claims, 12 Drawing Sheets

ELECTRONIC DEVICE

CROSS-REFERENCE TO RELATED APPLICATIONS

This patent document claims priority of Korean Patent Application No. 10-2016-0060289, entitled "ELECTRONIC DEVICE" and filed on May 17, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which sensing margin is increased by decreasing leakage current.

Also, the disclosed technology in this patent document includes memory circuits or devices and their applications in electronic devices or systems and various implementations of an electronic device in which read and write operation rates are raised by decreasing a Resistive-Capacitive (RC) delay value in a global bit line.

In one embodiment, an electronic device may include a semiconductor memory. The semiconductor memory may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix.

The semiconductor memory may be operable to control the isolation switch pairs to a cell matrix so that the plurality of the local line pairs of the selected cell matrix are floating while and the plurality of the local line pairs of a unselected cell matrix are driven at a ground voltage.

Each of the plurality of the cell matrices further may include: a plurality of local selection switch pairs that are coupled between both ends of the cell matrix and a corresponding local line pair among the plurality of the local line pairs; and one or more discharge switch pairs that are coupled to the corresponding local line pair among the plurality of the local line pairs.

The semiconductor memory may be operable to turn off the one or more discharge switch pairs of a cell matrix to make the corresponding local line pair floating, when the corresponding cell matrix among the plurality of the cell matrices is a selected cell matrix, and when the corresponding cell matrix among the plurality of the cell matrices is an unselected cell matrix, the one or more discharge switch pairs may be turned on to drive the corresponding local line pair at the ground voltage.

Each isolation switch pair may include a first isolation switch connecting or disconnecting a corresponding cell to or from the global bit line and a second isolation switch connecting or disconnecting the corresponding cell to or from the global source line.

Each storage cell may include a variable resistance element that exhibits different resistance states for storing data and includes a magnetic tunnel junction.

The semiconductor memory may further include: a global line driver that is coupled to the global line pair and drives the global line pair with a predetermined voltage during a read operation or a write operation.

Each of the resistive storage cells may include: a selection unit; and a variable resistance element whose resistance value is decided based on a data stored in the resistive storage cell.

The variable resistance element may include a phase change variable resistance element.

The electronic device may further include a microprocessor. The microprocessor may include a control unit for receiving a signal having a command from an outside of the microprocessor, extracting or decoding the command, or performing input/output control of the signal of the microprocessor; an operation unit for performing an operation according to a decoding result of the command in the control unit; and a storage unit for storing data to be operated, data corresponding to an operation result, or an address of the data to be operated. The semiconductor memory may be a part of the storage unit within the microprocessor.

The electronic device may further include a processor. The processor may include a core unit for performing an operation corresponding to a command using data according to the command input from an outside of the processor; a cache memory unit for storing data to be operated, data corresponding to an operation result, or an address of the data to be operated; and a bus interface which is coupled between the core unit and the cache memory unit, and transfers data between the core unit and the cache memory unit. The semiconductor memory may be a part of the cache memory unit within the processor.

The electronic device may further include a processing system. The processing system may include a processor for interpreting a received command, and controlling an operation of information according to an interpreting result of the command; an auxiliary memory device for storing a program for interpreting the command and the information; a main memory device for importing and storing the program and the information from the auxiliary memory device such that the processor may perform the operation using the program and the information when the program is executed; and an interface device for performing communication between one or more of the processor, the auxiliary memory device and the main memory device and an outside. The semiconductor memory may be a part of the auxiliary memory device or the main memory device within the processing system.

The electronic device may further include a data storage system. The data storage system may include a storage device for storing data and retaining the stored data regardless of a power supply; a controller for controlling data input/output of the storage device according to a command input from an outside; a temporary storage device for temporarily storing the data which is exchanged between the storage device and the outside; and an interface for performing communication between one or more of the storage device, the controller and the temporary storage device and the outside. The semiconductor memory may be a part of the storage device or the temporary storage device within the data storage system.

The electronic device may further include a memory system. The memory system may include a memory for storing data and retaining the stored data regardless of a power supply; a memory controller for controlling data input/output of the memory according to a command input from an outside; a buffer memory for buffering the data which is exchanged between the memory and the outside; and an interface for performing communication between one or more of the memory, the memory controller and the buffer memory and the outside. The semiconductor memory may be a part of the memory or the buffer memory within the memory system In another aspect, an electronic device including a semiconductor memory is provided to include a global line pair; first to Mth common node pairs, where the M is a natural number; first to Mth isolation switch pairs that are coupled between the global line pair and corresponding common node pairs among the first to Mth common node pairs; a plurality of first to Mth local line pairs; a plurality of first to Mth local selection switch pairs that are coupled between corresponding local line pairs among the plurality of the first to Mth local line pairs and corresponding common node pairs among the first to Mth common node pairs; and a plurality of resistive storage cells that are coupled between local lines of a corresponding local line pair among the plurality of the first to Mth local line pairs.

In some implementations, the semiconductor memory may further include a plurality of first to Mth discharge switch pairs that are coupled between the local lines of the corresponding local line pair among the plurality of the first to Mth local line pairs.

In some implementations, a common node pair corresponding to an isolation switch pair that is turned on among the first to Mth isolation switch pairs may be electrically connected to the global line pair.

In some implementations, a common node pair corresponding to an isolation switch pair that is turned off among the first to Mth isolation switch pairs may be electrically disconnected from the global line pair.

In some implementations, a local line pair corresponding to discharge switch pairs that are turned on among the plurality of the first to Mth discharge switch pairs may be driven with a ground voltage.

In some implementations, a local line pair corresponding to discharge switch pairs that are turned off among the plurality of the first to Mth discharge switch pairs may float.

In some implementations, discharge switch pairs corresponding to the isolation switch pair that is turned on may be turned off.

In some implementations, discharge switch pairs corresponding to the isolation switch pair that is turned off may be turned on.

In some implementations, the semiconductor memory may further include a global line driver that is coupled to the global line pair and drives the global line pair with a predetermined voltage during a read operation or a write operation.

In some implementations, each of the resistive storage cells may include a selection unit; and a variable resistance element whose resistance value is decided based on a data stored in the resistive storage cell.

In some implementations, the variable resistance element may include a metal oxide or a structure where a tunnel barrier layer is interposed between two magnetic layers, or both of the metal oxide and the structure where the tunnel barrier layer is interposed between two magnetic layers.

DETAILED DESCRIPTION

Figure 1:
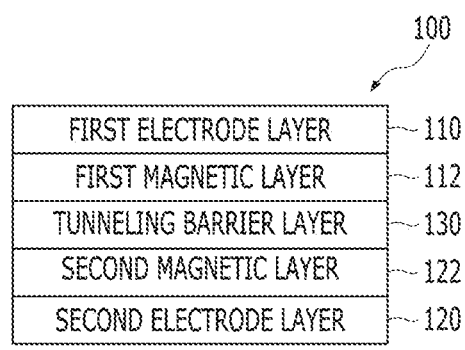
FIG. 1 illustrates a Magnetic Tunnel Junction (MTJ) where a tunnel barrier layer is interposed between two magnetic layers.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. Throughout the disclosure, like reference numerals refer to like parts throughout the various figures and embodiments of the present invention.

Semiconductor devices in accordance with the implementations of the present disclosure may include variable resistance elements that each exhibit different resistance states with different resistance values for storing data. Hereafter, the variable resistance elements may have variable resistance characteristics and include a single layer or a multi-layer. The variable resistance elements may include a material used for an RRAM (resistive random access memory), a PRAM (phase change random access memory), an FRAM (ferroelectric random access memory), an MRAM (magnetic random access memory), and the like. For example, the variable resistance elements may include a chalcogenide-based compound, a transition metal compound, a ferroelectric substance, or a ferromagnetic substance. This patent disclosure, however, is not limited to the above examples, and a suitable variable resistance element has a property of switching between different resistance states according to a voltage or current applied to its both ends.

In some implementations, a variable resistance element may include a metal oxide. Examples of the metal oxide may include transition metal oxides, such as nickel (Ni) oxides, titanium (Ti) oxides, hafnium (Hf) oxides, zirconium (Zr) oxides, tungsten (W) oxides, cobalt (Co) oxides, and perovskite-based materials, such as STO (SrTiO) and PCMO (PSCaMnO). The variable resistance element may have a property of switching between different resistance states as a current filament is formed or disappears as vacancy moves.

In some implementations, the variable resistance element may include a phase-change material, which may include a chalcogenide-based material, such as GST (Ge—Sb—Te). Such a variable resistance element can be stabilized into one state between a crystalline state as one resistance state and an amorphous state as another resistance state based on the temperature. the temperature of the variable resistance element can be controlled to switch the state of the element between two different resistance states.

In some implementations, the variable resistance element may include a structure where a tunnel barrier layer is interposed between two magnetic layers. The magnetic layers may be formed of or include a material, such as NiFeCo and CoFe, and the tunnel barrier layer may be formed of or include a material such as $Al_2O_3$. The variable resistance element switches between different resistance states according to the magnetization directions of the magnetic layers. For example, when the magnetization directions of the magnetic layers are in parallel, the variable resistance element may be in a low resistance state. When the magnetization directions of the magnetic layers are in anti-parallel, the variable resistance element may be in a high resistance state.

FIG. 1 illustrates a Magnetic Tunnel Junction (MTJ) where a tunnel barrier layer is interposed between two magnetic layers. Referring to FIG. 1, the MTJ 100 includes a first electrode layer 110 as a top electrode, a second electrode layer 120 as a bottom electrode, a pair of magnetic layers including a first magnetic layer 112 and a second magnetic layer 122, and a tunnel barrier layer 130 interposed between the first magnetic layer 112 and the second magnetic layer 122.

In some implementations, the first magnetic layer 112 may be or include a free ferromagnetic layer whose magnetization direction is varied according to the direction of the current applied to the MTJ 100, and the second magnetic layer 122 may be or include a pinned ferromagnetic layer whose magnetization direction is fixed.

The resistance state of the MTJ 100 varies with the relative direction of the first magnetic layer 112 with respect to the second magnetic layer 122 and the resistance value of the MTJ 100 varies according to the direction of the current that changes the relative direction of the first magnetic layer 112 with respect to the second magnetic layer 122 so as to write a data of "1" or "0" represented by one of the two resistance states.

Figure 2A:
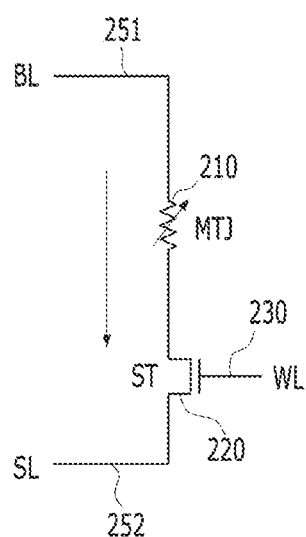
FIGS. 2A and 2B are schematic diagrams illustrating a principle of storing data in a variable resistance element 210.
Figure 2B:
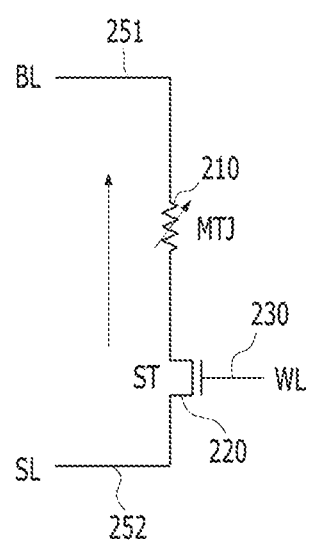

FIGS. 2A and 2B are schematic diagrams illustrating operations for storing data in a variable resistance element 210. The variable resistance element 210 may be or include the MTJ 100 which is described with reference to FIG. 1.

FIG. 2A describes the operation of storing a data of a logic low level in the variable resistance element 210. In a memory with an array of variable resistance elements 210, a variable resistance element 210 in which a data is to be stored may be selected by enabling a word line 230 coupled to the variable resistance element 210 and turning on a transistor 220 as a switching element that activates or deactivates the variable resistance element 210. When a current flows from a first end 251 to a second end 252, i.e., when the current from the first electrode layer 110 (the top electrode of the MTJ 100) to the second electrode layer 120 (the bottom electrode of the MTJ 100) as shown by the arrow direction shown in FIG. 1, the direction of first electrode layer 110 (the free ferromagnetic layer), comes to be in parallel to the direction of second electrode layer 120 (the pinned ferromagnetic layer) so as to set the variable resistance element 210 into a low resistance state. When the variable resistance element 210 is in a low resistance state, it is defined that a 'logic low' data is stored in the variable resistance element 210.

FIG. 2B describes the operation of storing a data of a logic high level in the variable resistance element 210. Likewise, the word line 230 coupled to the variable resistance element 210 is enabled to turn on the transistor 220. When a current flows from the second end 252 to the first end 251, i.e., when the current from the second electrode layer 120 to the first electrode layer 110 (arrow direction), the direction of first electrode layer 110 comes to be in anti-parallel to the direction of second electrode layer 120 so as to set the variable resistance element 210 into a high resistance state. When the variable resistance element 210 is in a high resistance state, it is defined that a 'logic high' data is stored in the variable resistance element 210.

The logic value of the data stored in the variable resistance element 210 depends on the resistance state of the variable resistance element 210. When the difference between the high resistance state and the low resistance state is large in the variable resistance element 210, it is relatively easy to read the data stored in the variable resistance element 210 because the two different resistance states are readily distinguishable from each other. However, when the difference between the high resistance state and the low resistance state is small in the variable resistance element 210, it can be difficult to correctly read the data stored in the variable resistance element 210, raising the probability of erroneously reading the data. Therefore, it is desirable to develop a technology capable of accurately reading the data stored in a variable resistance element even through the difference between the high resistance state and the low resistance state is small in the variable resistance element.

Figure 3:
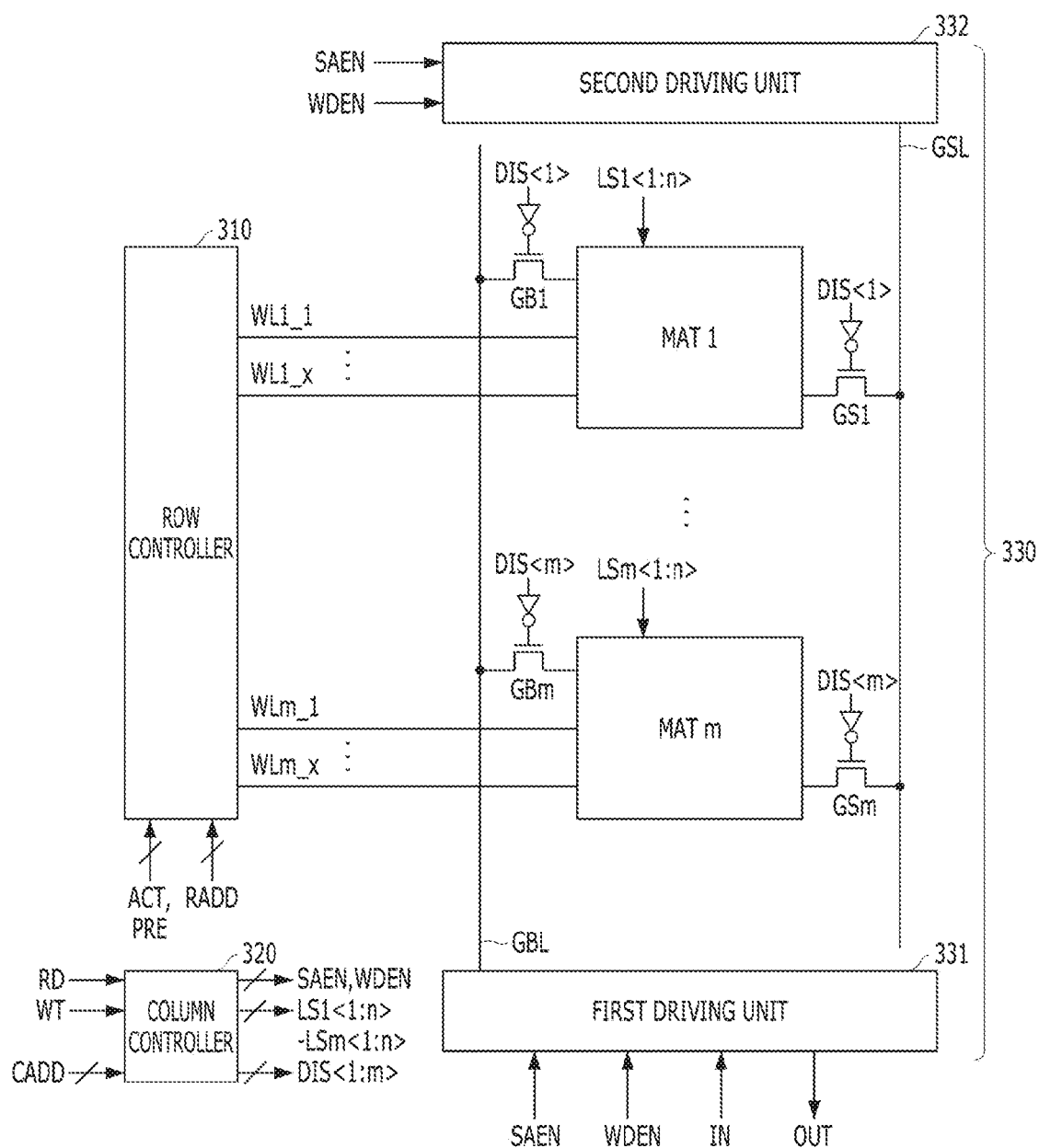
FIG. 3 is a schematic diagram illustrating a memory circuit (device) including the variable resistance element 210 in accordance with an implementation.

FIG. 3 is a schematic diagram illustrating a memory circuit (device) including the variable resistance element 210 in accordance with an implementation.

Referring to FIG. 3, the memory circuit (or device) may include a plurality of cell matrices MAT1 to MATm (where "m" is a natural number), a pair of global lines GBL and GSL, a plurality of isolation switch pairs GB1/GS1 to GBm/GSm, a row controller 310, a column controller 320, a global line driver 330 including a first driving unit 331 and a second driving unit 332.

The global line pair GBL and GSL may include a global bit line GBL and a global source line GSL. The isolation switch pairs GB1/GS1 to GBm/GSm may include first isolation switches GB1 to GBm that are coupled between a corresponding cell matrix and the global bit line GBL and second isolation switches GS1 to GSm that are coupled between the corresponding cell matrix and the global source line GSL.

Figure 4:
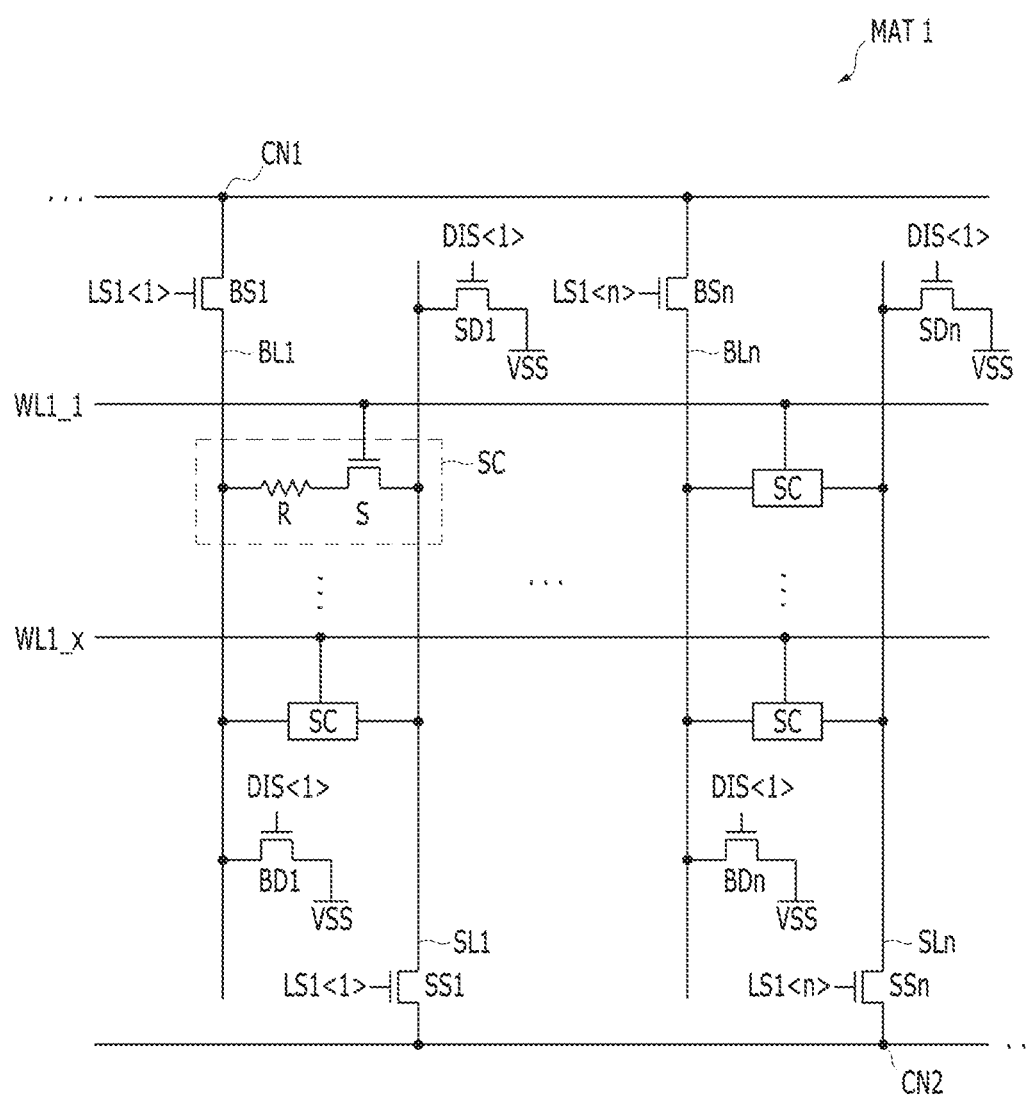
FIG. 4 is a schematic diagram illustrating an internal structure of a cell matrix MAT1.

FIG. 4 is a schematic diagram illustrating an internal structure of a cell matrix MAT1.

Referring to FIG. 4, the cell matrix MAT1 may include a plurality of local line pairs BL1/SL1 to BLn/SLn (where "n" is a natural number), a plurality of resistive storage cells SC that are coupled between a corresponding pair of local lines among the local line pairs BL1/SL1 to BLn/SLn (where "n" is a natural number), a pair of common nodes CN1 and CN2, local selection switch pairs BS1/SS1 to BSn/SSn and a plurality of discharge switch pairs BD1/SD1 to BDn/SDn.

Each of the local line pairs BL1/SL1 to BLn/SLn may include a local bit line BL1 to BLn and a local source line SL1 to SLn. The local selection switch pairs BS1/SS1 to BSn/SSn may include first local selection switches BS1 to BSn that are coupled between a corresponding local bit line BL1 to BLn and the common node CN1, and second local selection switches SS1 to SSn that are coupled between a corresponding local source line SL1 to SLn and the common node CN2. The discharge switch pairs BD1/SD1 to BDn/SDn may include the discharge switches BD1 to BDn that are coupled between a corresponding local bit line BL1 to BLn and the common node CN2, and the discharge switches SD1 to SDn that are coupled between a corresponding local source line SL1 to SLn and the common node CN1.

The resistive storage cells SC may include a variable resistance element R and a selection unit S that is serially coupled to the variable resistance element R. In some implementations, the variable resistance element R may have a low resistance state when a 'logic low' data is stored. When a 'logic high' data is stored, the variable resistance element R may have a high resistance state. In some implementations, the variable resistance element R may have a low resistance state when a 'logic high' data is stored, and when a 'logic low' data is stored, the variable resistance element R may have a high resistance state. Hereafter, as one implementation, it is assumed that the memory circuit follows the former case where the variable resistance element R has a low resistance state when a 'logic low' data is stored and a high resistance state when a 'logic high' data is stored. The selection unit S may be turned on or off in response to the voltage of a plurality of word lines $WL1\_1$ to $WL1\_x$, where "x" is a natural number. Herein, for the sake of convenience in illustration, FIG. 4 shows an internal structure of one resistive storage cell SC.

The local selection switch pairs BS1/SS1 to BSn/SSn may be turned on when corresponding local selection signals among a plurality of local selection signals LS1<1:n> are enabled, and turned off when corresponding local selection signals among the local selection signals LS1<1:n> are disabled. A local selection switch pair that is turned on may electrically connect the local bit line BL1 to BLn or the local source line SL1 to SLn of a corresponding local line pair to the common node pair CN1 or CN2. A local selection switch pair that is turned off may electrically disconnect the local bit line BL1 to BLn or the local source line SL1 to SLn of a corresponding local line pair from the common node pair CN1 or CN2.

The discharge switch pairs BD1/SD1 to BDn/SDn may be turned on when a corresponding discharge signal DIS<1> is enabled. When the corresponding discharge signal DIS<1> is disabled, the discharge switch pairs BD1/SD1 to BDn/SDn may be turned off. When the discharge switch pairs BD1/SD1 to BDn/SDn are turned on, the corresponding local line pairs may be driven to a ground voltage VSS. When the discharge switch pairs BD1/SD1 to BDn/SDn are turned off, the corresponding local line pairs may become floating.

Although FIG. 4 shows the internal structure of the cell matrix MAT1 only, other cell matrices MAT2 to MATm may have the same structure and operate in the same manner as shown in FIG. 4.

When an active signal ACT is enabled, the row controller 310 activates the word lines $WL1\_1$ to $WL1\_x$ to $WLm\_1$ to $WLm\_x$ that correspond to a row address RADD. When a precharge signal PRE is enabled, the row controller 310 may precharge the activated word lines.

The column controller 320 may generate first and second enable signal SAEN and WDEN, a plurality of discharge signals DIS<1:m>, and a plurality of local selection signals LS1<1:n> to LSm<1:n>. When a read signal RD is enabled, the column controller 320 may enable the first enable signal SAEN, and when a write signal WT is enabled, the column controller 320 may enable the second enable signal WDEN.

When the read signal RD or the write signal WT is enabled, the column controller 320 may disable a discharge signal designated by a column address CADD among the multiple discharge signals DIS<1:m> while enabling the other discharge signals, enable a local selection signal designated by the column address CADD among the multiple local selection signals LS1<1:n> to LSm<1:n> while disabling the other local selection signals.

For example, when the column address CADD designates a local line pair BL1/SL1 of the cell matrix MAT1, the column controller 320 may disable a discharge signal DIS<1> corresponding to the selected cell matrix MAT1 to a logic low level and enable the other discharge signals DIS<2:m> to a logic high level. Also, the column controller 320 may enable a local selection signal LS1<1> corresponding to the selected local line pair BL1/SL1 to a logic high level, and disable the other local selection signals LS1<2:n> to LSm<1:n> to a logic low level.

Herein, the active signal ACT, the precharge signal PRE, the read signal RD, and the write signal WT may be enabled, respectively, when an active command, a precharge command, a read command, and a write command are applied to the memory device (circuit).

When a corresponding discharge signal is enabled, the isolation switch pairs GB1/GS1 to GBm/GSm may be turned off. When the corresponding discharge signal is disabled, the isolation switch pairs GB1/GS1 to GBm/GSm may be turned on. The signals controlling the isolation switch pairs GB1/GS1 to GBm/GSm may be or include the signals obtained by inverting the corresponding discharge signals DIS<1:m>. Among the isolation switch pairs GB1/GS1 to GBm/GSm, the isolation switch pairs that are turned on may electrically connect the global line pairs GBL and GSL and a corresponding cell matrix to each other, and the isolation switch pairs that are turned off may electrically disconnect the global line pairs GBL and GSL from the corresponding cell matrix.

For example, when the cell matrix MAT1 is selected, the discharge signal DIS<1> is disabled and the other discharge signals DIS<2:m> are enabled so as to turn on the isolation switch pair GB1/GS1 while turning off the other isolation switch pairs GB2/GS2 to GBm/GSm. The isolation switch pair GB1/GS1 may electrically connect the cell matrix MAT1 to the global line pair GBL and GSL, and other isolation switch pairs GB2/GS2 to GBm/GSm may electrically disconnect the corresponding cell matrices MAT2 to MATm from the global line pair GBL and GSL.

The discharge switch pairs BD1/SD1 to BDn/SDn may be turned on when the corresponding discharge signal DIS<1> is enabled, and the discharge switch pairs BD1/SD1 to BDn/SDn may be turned off when the discharge signal DIS<1> is disabled. When the discharge switch pairs BD1/SD1 to BDn/SDn are turned on, the corresponding local line pairs may be driven to the ground voltage VSS, and when the discharge switch pairs BD1/SD1 to BDn/SDn are turned off, the corresponding local line pairs may become floating.

The global line driver 330 may sense and output the data stored in the selected resistive storage cell (OUT) when the first enable signal SAEN is enabled, and when the second enable signal WDEN is enabled, the global line driver 330 may have an input data IN written in the selected resistive storage cell. For these operations, the global line driver 330 may include a first driving unit 331 and a second driving unit 332.

When the first enable signal SAEN is enabled, the global line driver 330 may supply a read voltage to the global line pair GBL and GSL so that a read current flows through the selected resistive storage cell and the data of the selected resistive storage cell may be sensed.

For example, when a resistive storage cell SC corresponding to the cell matrix MAT1, the local line pair BL1/SL1, and the word line WL1_1 is selected, the first driving unit 331 may drive the global bit line GBL with a read voltage which is higher than the ground voltage VSS, and the second driving unit 332 may drive the global source line GSL with the ground voltage VSS.

Figure 5A:
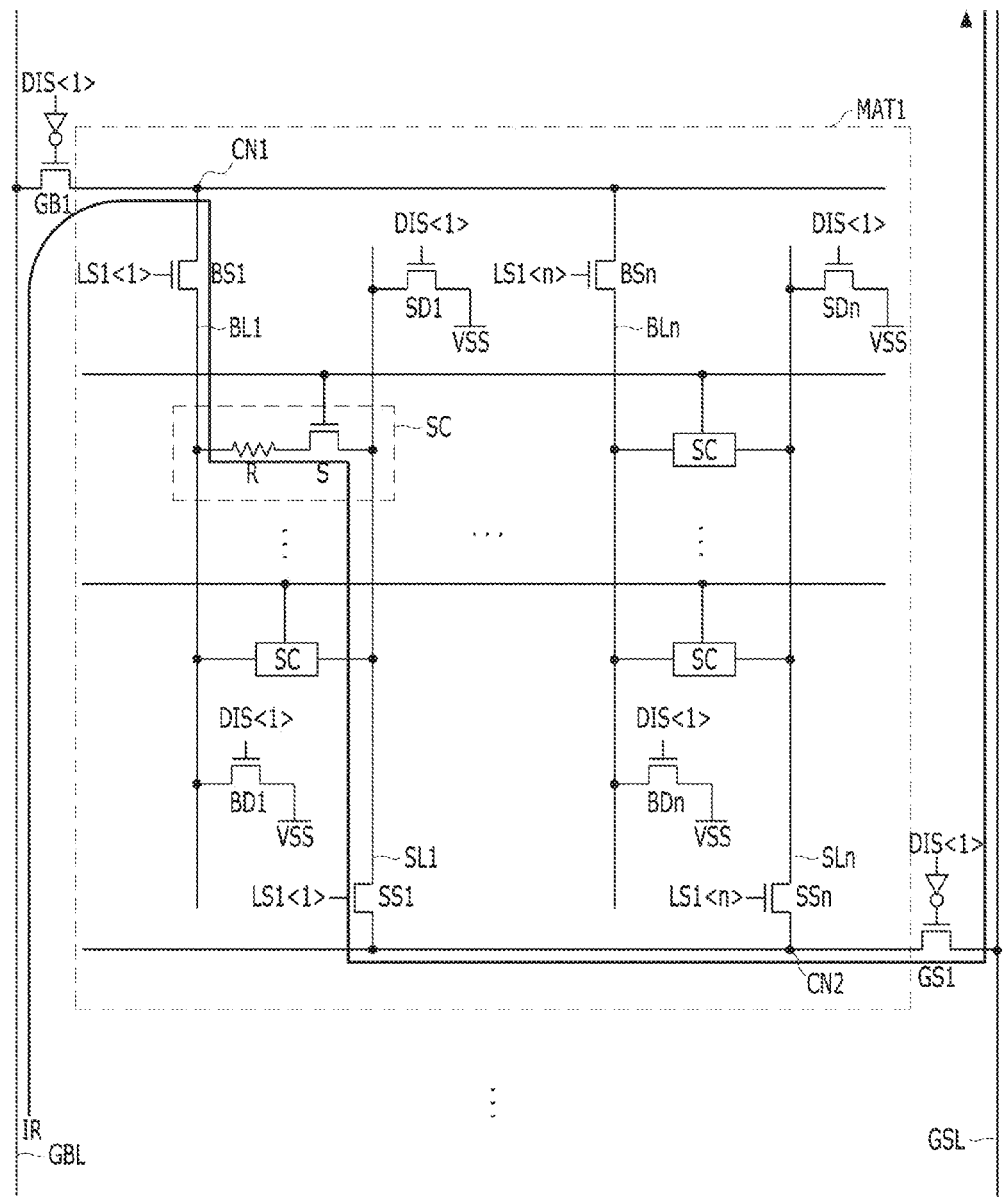
FIG. 5A is a schematic diagram illustrating how a read current (IR) flows during a read operation when a resistive storage cell SC corresponding to a cell matrix MAT1, a local line pair BL1/SL1 and a word line WL1_1 is selected.

FIG. 5A is a schematic diagram illustrating how a read current IR flows during a read operation when a resistive storage cell SC corresponding to the cell matrix MAT1, the local line pair BL1/SL1 and the word line WL1_1 is selected.

Referring to FIG. 5A, the read current IR flows from the first driving unit 331 through the route of the global bit line GBL, a first isolation switch GB1 of the cell matrix MAT1, a common node CN1 of the cell matrix MAT1, a local selection switch BS1, a local bit line BL1, a storage cell SC, a local source line SL1, a local selection switch SS1, a common node CN2 of the cell matrix MAT1, a second isolation switch GS1, and a global source line GSL, and a data of the resistive storage cell SC that is sensed through the read current IR may be outputted (OUT).

When the second enable signal WDEN is enabled, the global line driver 330 applies a write voltage to the global line pair GBL and GSL in a direction based on the input data IN so as to provide a write current flowing through a selected resistive storage cell so that the input data IN is written in the selected resistive storage cell.

For example, when a resistive storage cell SC corresponding to the cell matrix MAT1, the local line pair BL1/SL1 and the word line WL1_1 is selected and a data '0' is to be written in the selected resistive storage cell SC, the first driving unit 331 may drive the global bit line GBL with a first write voltage that is higher than the ground voltage VSS and the second driving unit 332 may drive the global source line GSL with the ground voltage VSS. When a data '1' is to be written, the second driving unit 332 may drive the global source line GSL with a second write voltage that is higher than the ground voltage VSS and the first driving unit 331 may drive the global bit line GBL with the ground voltage VSS.

Figure 5B:
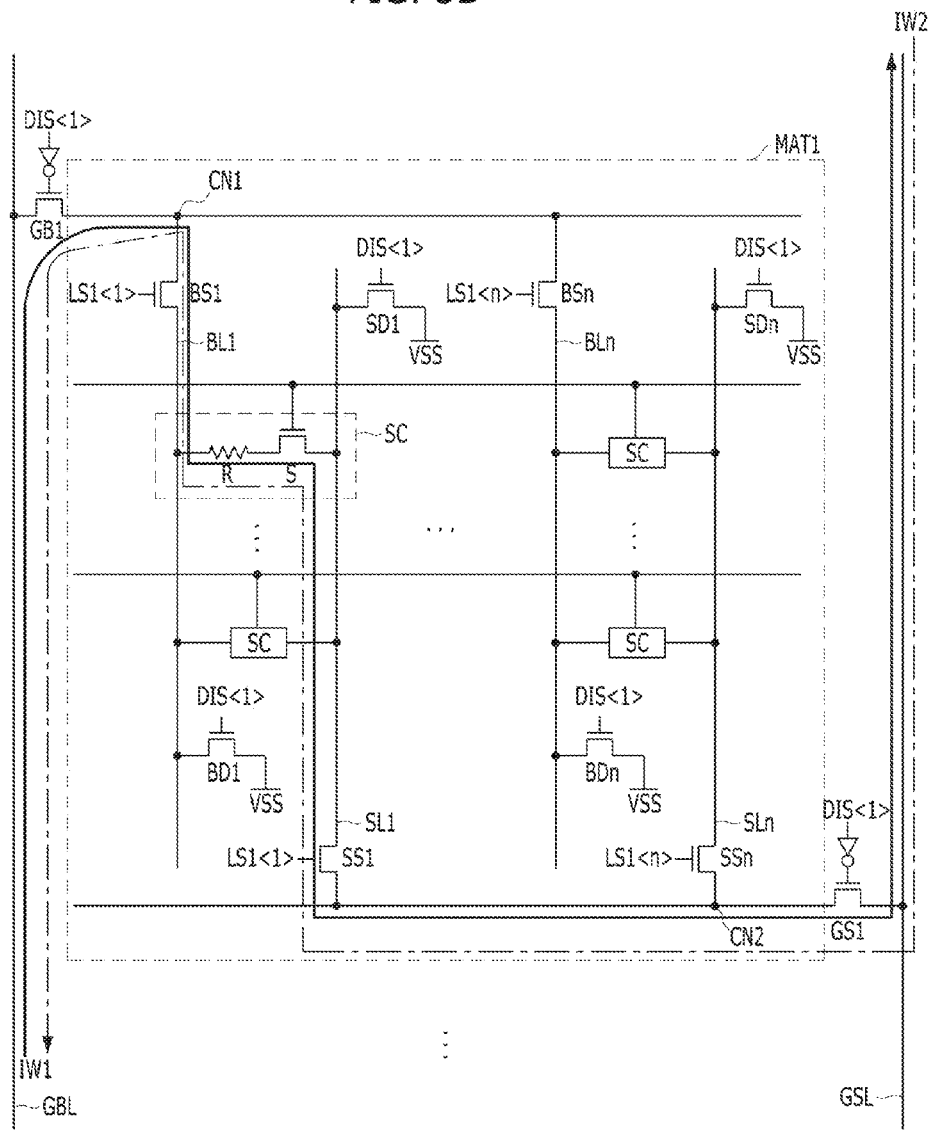
FIG. 5B is a schematic diagram illustrating how write currents (IW1 and IW2) flow during a write operation when a resistive storage cell SC corresponding to the cell matrix MAT1, the local line pair BL1/SL1 and the word line WL1_1 is selected.

FIG. 5B is a schematic diagram illustrating how write currents IW1 and IW2 flow during a write operation when the resistive storage cell SC corresponding to the cell matrix MAT1, the local line pair BL1/SL1 and the word line WL1_1 is selected.

When a data '0' is written, a first write current IW1 flows in the same direction as that of the read current IR through the same route that the read current IR flows so that a variable resistance element of the selected resistive storage cell SC is switched into a low resistance state and the data '0' is written (see the solid line arrow in FIG. 5B). When a data '1' is written, a second write current IW2 flows in the opposite direction to that of the read current IR so that the variable resistance element of the selected resistive storage cell SC is switched into a high resistance state and the data '1' is written (see the dotted line arrow in FIG. 5B).

Figure 6A:
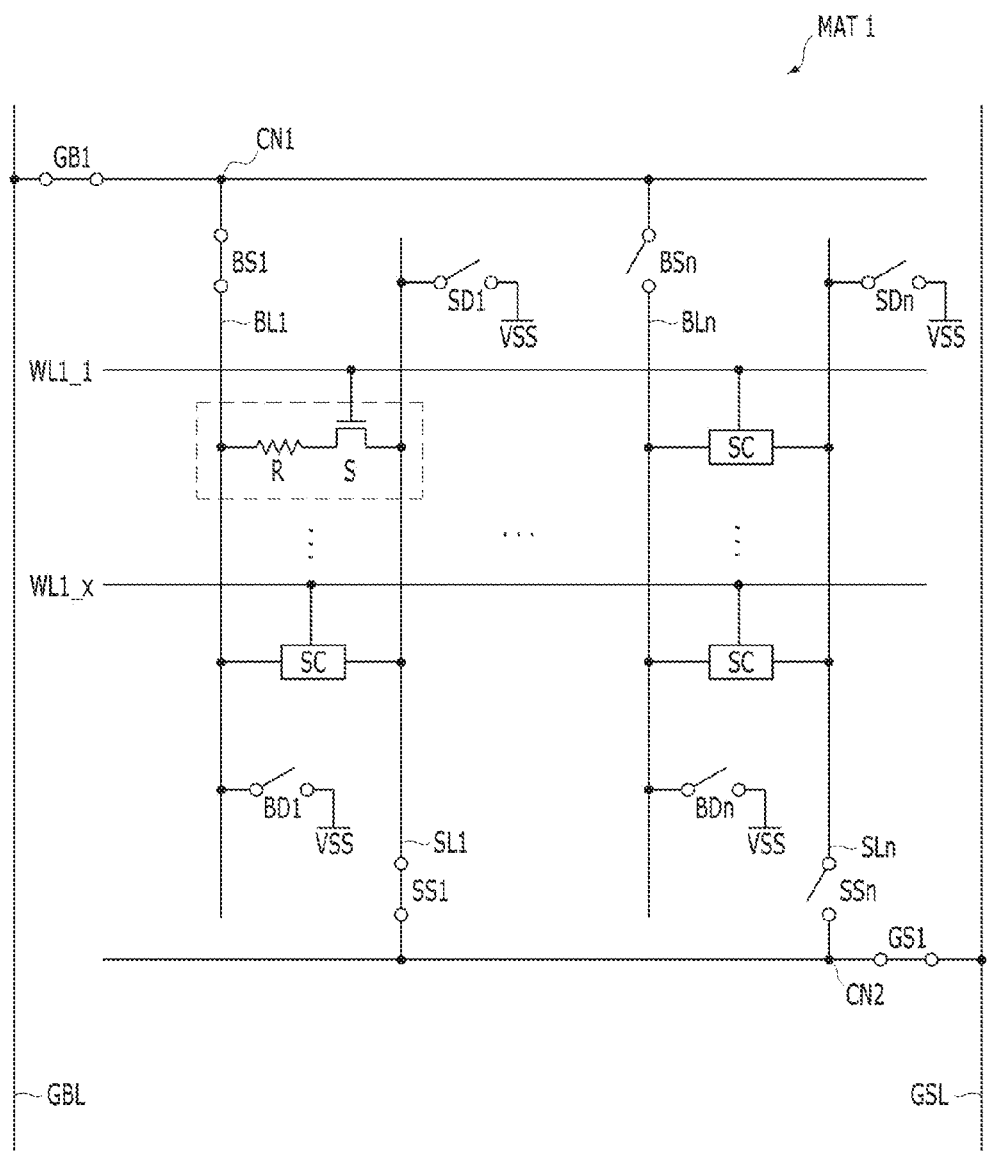
FIG. 6A is a schematic diagram illustrating on/off states of switches corresponding to a cell matrix MAT1 selected during a read or write operation.

FIG. 6A is a schematic diagram illustrating on or off states of the local selection switches BS1/SS1 and the discharge switch pairs BD1/SD1 of the cell matrix MAT1 during a read or write operation, when the cell matrix MAT1 is selected for the read or write operation.

Referring to FIG. 6A, the isolation switch pair GB1/GS1 corresponding to the cell matrix MAT1 may be turned on, and the local selection switch pair BS1/SS1 corresponding to a selected local line pair BL1/SL1 among the multiple local selection switch pairs BS1/SS1 to BSn/SSn may be turned on while other local selection switch pairs BS2/SS2 to BSn/SSn are turned off. Also, all the discharge switch pairs BD1/SD1 to BDn/SDn coupled to any line of the local line pairs BL1/SL1 to BLn/SLn may be turned off.

Figure 6B:
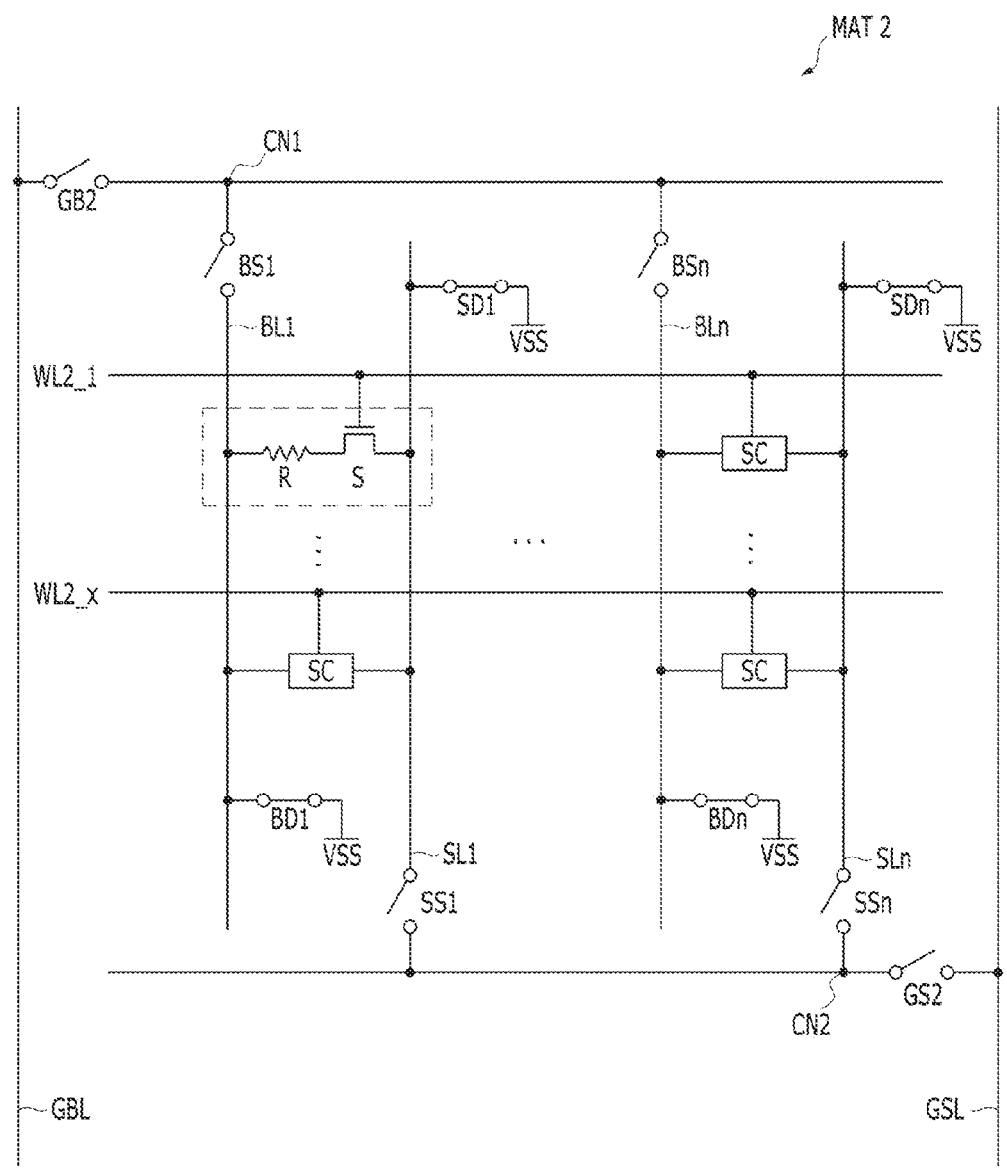
FIG. 6B is a schematic diagram illustrating on/off states of switches corresponding to a cell matrix MAT2 that is not selected during a read or write operation.

FIG. 6B is a schematic diagram illustrating on or off states of the local selection switches BS1/SS1 and the discharge switch pairs BD1/SD1 of a cell matrix MAT2 during a read or write operation, when the cell matrix MAT2 is not selected for the read or write operation.

Referring to FIG. 6B, an isolation switch pair GB2/GS2 corresponding to the cell matrix MAT2 may be turned off, and all the discharge switch pairs BD1/SD1 to BDn/SDn coupled to any line of the local line pairs BL1/SL1 to BLn/SLn may be turned on.

As shown in FIG. 6B, since the cell matrices not selected by the memory device (circuit) are electrically shut off from the global line pair by the corresponding isolation switch pair, the parasitic components (which include parasitic resistance and parasitic capacitance) existing in the cell matrices not selected are not shown in the global line pair. Therefore, the RC delay can be decreased, which leads to an increased operation rate.

Also, when the common node is directly coupled to the global line pair in an unselected cell matrix without an isolation switch pair, leakage current may occur between the global line pair and the local line pair due to a bridge effect when the voltage of the global line pair becomes high. However, the bridge effect may be prevented by making the common node of the unselected cell matrix floating in the memory device (circuit) of FIG. 3. Therefore, malfunction or power consumption that may be caused by the leakage current may be reduced.

The electronic devices according to the implementations of the present disclosure may have increased sensing margin as the leakage current occurring in a pair of local lines is decreased.

Also, the electronic devices according to the implementations of the present disclosure may have increased read and write operation rates by decreasing the RC delay value appearing in a global bit line.

The memory circuit or the semiconductor device as described above may be used in various devices or systems. Some of devices or systems which may be implemented with the memory circuit or the semiconductor device as described above are illustrated in FIGS. 7 to 11.

Figure 7:
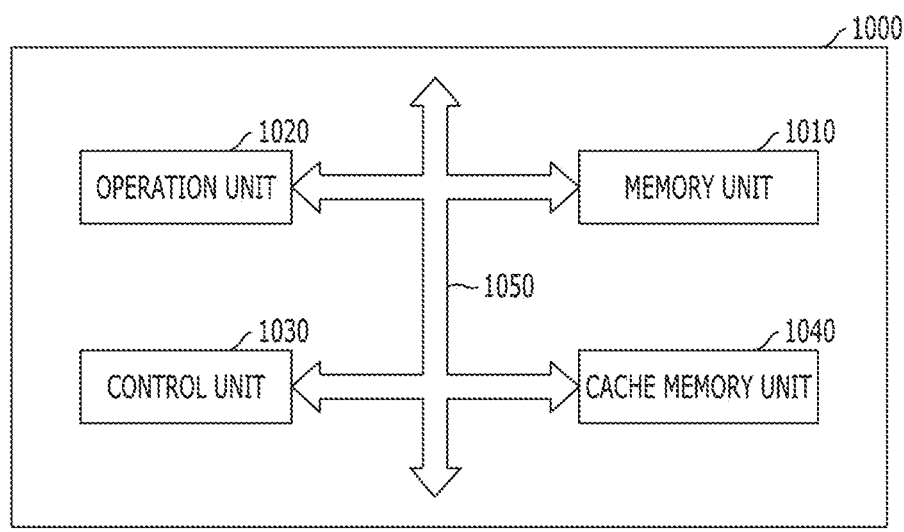
FIG. 7 is a configuration diagram illustrating an example of a microprocessor which is implemented with a memory device in accordance with an embodiment.

FIG. 7 is a configuration diagram illustrating an example of a microprocessor which is implemented with a memory device in accordance with an embodiment.

Referring to FIG. 7, a microprocessor 1000 may control and adjust a series of processes which receives data from various external devices, processes the data, and then sends a result to the external devices. The microprocessor 1000 may include a storage unit 1010, an operation unit 1020, a control unit 1030 and so on. The microprocessor 1000 may be various data processing devices such as a central processing unit (CPU), a graphic processing unit (GPU), a digital signal processor (DSP), an application processor (AP) and so on.

The storage unit 1010 may be a processor register, a register and so on, and be a part for storing the data in the microprocessor 1000. The storage unit 1010 may include a data register, an address register, a floating-point register, other various registers and so on. The storage unit 1010 may serve to temporarily store the data for performing an operation, the operation result data in the operation unit 1020, and an address in which the data is stored to be performed.

The storage unit 1010 may include one or more of the embodiments of the memory device as described above. For example, the storage unit 1010 may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix. Through this, an operation speed of the storage unit 1010 may be increased and a power consumption of the storage unit 1010 may be reduced. Consequently, a performance of the microprocessor 1000 may be improved and a power consumption of the microprocessor 1000 may be reduced.

The operation unit 1020 may perform a number of arithmetic and logical operations according to a result of decoding a command by the control unit 1030. The operation unit 1020 may include one or more arithmetic and logic units (ALU) and so on.

The control unit 1030 may receive a signal from the storage unit 1010, the operation unit 1020, an external device of the microprocessor 1000 and so on, and perform extraction or decode of the command, signal input/output control of the microprocessor 1000 and execute the processing which is represented by the program.

The microprocessor 1000 in accordance with the embodiment may further include a cache memory unit 1040 which may temporarily store data to be output to the external device or is input from the external device in addition to the storage unit 1010. The cache memory unit 1040 may exchange the data with the storage unit 1010, the operation unit 1020 and the control unit 1030 through a bus interface 1050.

Figure 8:
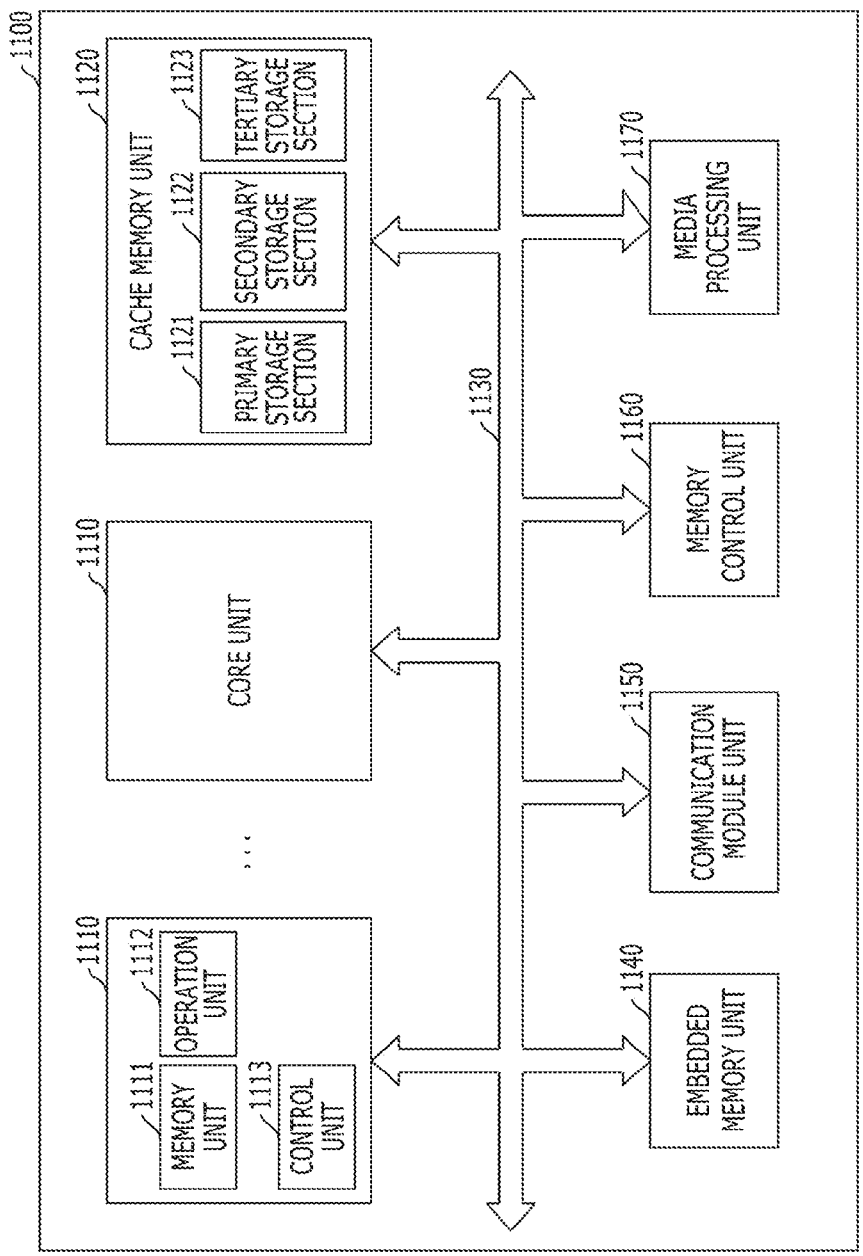
FIG. 8 is a configuration diagram illustrating an example of a processor which is implemented with a memory device in accordance with an embodiment.

FIG. 8 is a configuration diagram illustrating an example of a processor which is implemented with a memory device in accordance with an embodiment.

Referring to FIG. 8, a processor 1100 may improve performance and implement multi functions by including various functions in addition to a function of the microprocessor that control and adjust a series of processes which receives data from various external devices, processes the data, and then sends a result to the external devices. The processor 1100 may include a core unit 1110 serving as the microprocessor, a cache memory unit 1120 for temporarily storing data and a bus interface 1130 for transferring the data between an internal device and the external device. The processor 1100 may include a variety of system on chips (SoC) such as a multi core processor, a graphic processing unit (GPU), an application processor (AP) and so on.

The core unit 1110 may be a part for arithmetic and logic operating data input from the external device, and may include a storage unit 1111, an operation unit 1112 and a control unit 1113.

The storage unit 1111 may be a processor register, a register and so on, and be a part for storing the data in the processor 1100. The storage unit 1111 may include a data register, an address register, a floating-point register, other various registers and so on. The storage unit 1111 may serve to temporarily store the data for performing an operation, the operation result data in the operation unit 1112, and an address in which the data is stored to be performed. The operation unit 1112 is a part of performing the operation within the processor 1100, and may perform a number of arithmetic and logical operations according to a result of decoding a command by the control unit 1113. The operation unit 1112 may include one or more arithmetic and logic units (ALU) and so on. The control unit 1113 may receive a signal from the storage unit 1111, the operation unit 1112, the external device of the processor 1100 and so on, and perform extraction or decode of the command, signal input/output control of the processor 1111 and execute the processing which is represented by the program.

The cache memory unit 1120 is a part of temporarily storing data to compensate the data processing speed difference between the core unit 1110 which operates at high speed and the external device which operates at low speed. The cache memory unit 1120 may include a primary storage unit 1121, a secondary storage unit 1122, and a tertiary storage unit 1123. Generally, the cache memory unit 1120 may include the primary storage unit 1121 and the secondary storage unit 1122, and when high capacity is needed, the cache memory unit 1120 may include the third storage unit 1123. The cache memory unit 1120 may include more storage units as required. That is, the number of storage units which is included in the cache memory may depend on the design. The speeds for storing and determining data in the primary, the secondary and the tertiary storage units 1121, 1122 and 1123 may be the same as each other or be different from each other. When processing speeds of the storage units are different, a speed of the primary storage unit may be fastest. One or more storage units among the primary storage unit 1121, the secondary storage unit 1122 and the tertiary storage unit 1123 of the cache memory unit 1120 may include one or more of the embodiments of the memory devices as described above. For example, the cache memory unit 1120 may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix. Through this, an operation speed of the cache memory unit 1120 may be increased and a power consumption of the cache memory unit 1120 may be reduced. Consequently, a performance of the processor 1100 may be improved and a power consumption of the processor 1100 may be reduced.

FIG. 8 is the configuration diagram illustrating all of the primary, the secondary and the tertiary storage units 1121, 1122 and 1123 are configured within the cache memory unit 1120. However, all of the primary, the secondary and the tertiary storage units 1121, 1122 and 1123 of the cache memory unit 1120 are configured in the outside of the core unit 1110, and the processing speed difference may be compensated between the core unit 1110 and the external device. Also, the primary storage unit 1121 of the cache memory unit 1120 may be configured within the core unit 1110, and the secondary and the tertiary storage units 1122 and 1123 may be configured in the outside of the core unit 1110, and the complementary function of the processing speed difference may be enhanced. Also, the primary and the secondary storage units 1121 and 1122 may be configured within the core unit 1110, and the tertiary storage unit 1123 may be configured in the outside of the core unit 1110.

The bus interface 1130 is a part which allows data to be efficiently transmitted by coupling the core unit 1110, the cache memory unit 1120 and the external device.

The processor 1100 may include a plurality of the core units 1110, and the plurality of the core units 1110 may share the cache memory unit 1120. The plurality of the core units 1110 and the cache memory unit 1120 may be coupled directly, or may be coupled through the bus interface 1130. All of the plurality of the core units 1110 may have the same configuration as the core unit as described above. When the processor 1100 includes the plurality of the core units 1110, the primary storage unit 1121 of the cache memory unit 1120 may correspond to the number of a plurality of the core units 1110 and the primary storage unit 1121 may be configured in each of the core unit 1110, and the secondary and the tertiary storage units 1122 and 1123 may be configured in the outsides of the plurality of the core units 1110 to be shared through the bus interface 1130. Herein, the processing speed of the primary storage unit 1121 may be faster than the processing speeds of the secondary and the tertiary storage units 1122 and 1123. In the other embodiment, the primary storage unit 1121 and the secondary storage units 1122 may correspond to the number of the plurality of the core units 1110, and may be configured in each of the core unit 1110, the tertiary storage unit 1123 may be configured to be shared through the interface in the outsides of the plurality of the core units 1110.

The processor 1100 may further include an embedded memory unit 1140 for storing data, a communication module unit 1150 for sending and receiving the data with the external device in a wired or wireless manner, a memory control unit 1160 for driving an external storage device, a media processing unit 1170 for processing data processed in the processor 1100 or data input from an external input device and outputting the processed data to the external interface device and so on, and may further include a plurality of modules and devices. The plurality of the modules which are added may exchange the data with the core unit 1110 and the cache memory unit 1120 through the bus interface 1130.

The embedded memory unit 1140 may include a non-volatile memory as well as a volatile memory. The volatile memory may include a dynamic random access memory (DRAM), a mobile DRAM, a static random access memory (SRAM) and a memory for performing a function similar thereto, and the non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM) and the memory for performing the function similar thereto.

The communication module unit 1150 may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) and so on as like various devices for sending and receiving the data without a transmission line.

The memory control unit 1160 may process and manage the data which is transmitted between the processor 1100 and the external storage device which operates according to a different communication standard from the processor 1100, and include various controllers for controlling memory controllers such as an integrated device electronics (IDE), a serial advanced technology attachment (SATA), a small computer system interface (SCSI), a redundant array of independent disks (RAID), a solid state disk (SSD), an external SATA (eSATA), a personal computer memory card international association (PCMCIA), an universal serial bus (USB), a secure digital card (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The media processing unit 1170 may process the data which is processed in the processor 1100 or which is input in a video, an audio, and other forms from the external input device, and output the data to the external interface device. The media processing unit 1170 may include a graphics processing unit (GPU), a digital signal processor (DSP), a high definition audio (HD Audio), a high definition multimedia interface (HDMI) controller and so on.

Figure 9:
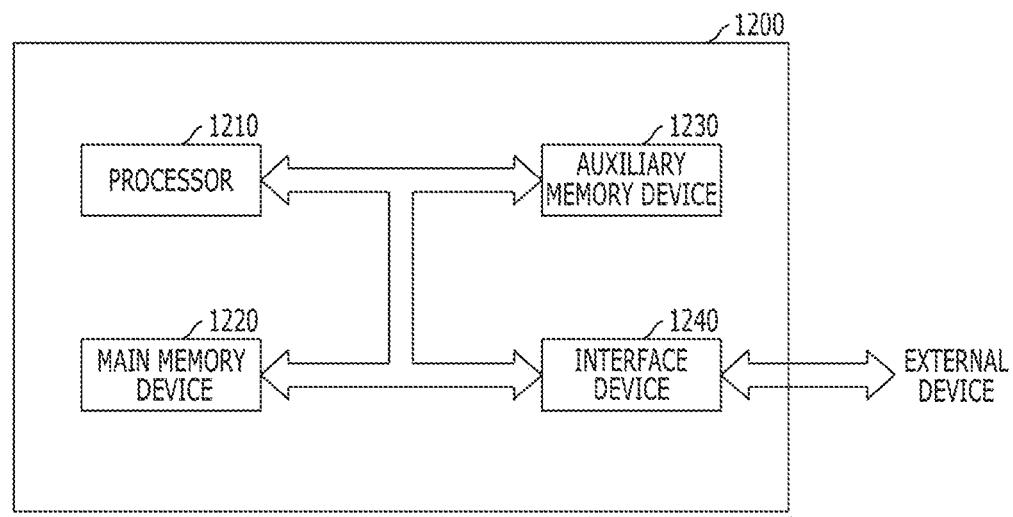
FIG. 9 is a configuration diagram illustrating an example of a system which is implemented with a memory device in accordance with an embodiment.

FIG. 9 is a configuration diagram illustrating an example of a system which is implemented with a memory device in accordance with an embodiment.

Referring to FIG. 9, a system 1200 is a device for processing data, and may perform input, processing, output, communication, storage and so on the data for performing a series of operations. The system 1200 may include a processor 1210, a main memory device 1220, an auxiliary memory device 1230, an interface device 1240 and so on. The system 1200 may be various electronic systems which operate using a process such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, a telematics, an audio visual system, a smart television and so on.

The processor 1210 may control processing such as interpretation of an input command, operation and comparison of the data stored in the system 1200 and so on. The processor 1210 may include a micro processor unit (MPU), a central processing unit (CPU), a single/multi core processor, a graphic processing unit (GPU), an application processor (AP), a digital signal processor (DSP) and so on.

The main memory device 1220 may be a memory device which imports a program code or data from the auxiliary memory device 1230, and stores and execute the program code or the data when the program is performed. Contents which are stored in the main memory device 1220 may be retained when power is interrupted. The main memory device 1220 may include a global line pair; a plurality of cell matrices each of which includes a plurality of local line pairs and one or more resistive storage cells that are coupled between local lines of a corresponding local line pair among the plurality of the local line pairs; and a plurality of isolation switch pairs which are coupled between both ends of corresponding cell matrices and the global line pair, wherein isolation switch pairs corresponding to selected cell matrices among the plurality of the cell matrices are turned on and isolation switch pairs corresponding to unselected cell matrices are turned off. Through this, an operation speed of the main memory device 1220 may be increased and a power consumption of the main memory device 1220 may be reduced. Consequently, a performance of the system 1200 may be improved and a power consumption of the system 1200 may be reduced.

The main memory device 1220 may further include a volatile memory which contents are entirely erased when the power is interrupted, such as a static random access memory (SRAM), a dynamic random access memory (DRAM) and so on. On the other hand, the main memory device 1220 may not include the embodiments of the memory devices as described above, and may include the volatile memory which contents are entirely erased when the power is interrupted, such as the static random access memory (SRAM), the dynamic random access memory (DRAM) and so on.

The auxiliary memory device 1230 may be a memory device for storing data and a program code. A speed of the auxiliary memory device 1230 is slower than the speed of the main memory device 1220, but the auxiliary memory device 1230 may store a lot of data. The auxiliary memory device 1230 may include a global line pair; a plurality of cell matrices each of which includes a plurality of local line pairs and one or more resistive storage cells that are coupled between local lines of a corresponding local line pair among the plurality of the local line pairs; and a plurality of isolation switch pairs which are coupled between both ends of corresponding cell matrices and the global line pair, wherein isolation switch pairs corresponding to selected cell matrices among the plurality of the cell matrices are turned on and isolation switch pairs corresponding to unselected cell matrices are turned off. Through this, an operation speed of the main memory device 1220 may be increased and a power consumption of the main memory device 1220 may be reduced. Consequently, a performance of the system 1200 may be improved and a power consumption of the system 1200 may be reduced.

The auxiliary memory device 1230 may further include a data storage system such as a magnetic tape and a magnetic disk using magnetism, a laser disk using light, a magnetic-optical disk using the light and the magnetism, a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on. On the other hand, the auxiliary memory device 1230 may not include the embodiments of the memory devices as described above, and may include the data storage system such as the magnetic tape and the magnetic disk using magnetism, the laser disk using light, the magnetic-optical disk using the light and the magnetism, the solid state disk (SSD), the universal serial bus memory (USBM), the secure digital (SD), the mini secure digital card (mSD), the micro (SD), the secure digital high capacity (SDHC), the memory stick card, the smart media card (SM), the multi media card (MMC), the embedded MMC (eMMC), the compact flash (CF) and so on.

The interface device 1240 may exchange a command, data and so on between the system 1200 and the external device, and be a keypad, a keyboard, a mouse, a speaker, a mike, a display, a human interface device (HID), a communication device and so on. The communication device may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) as like various devices for sending and receiving the data without a transmission line.

Figure 10:
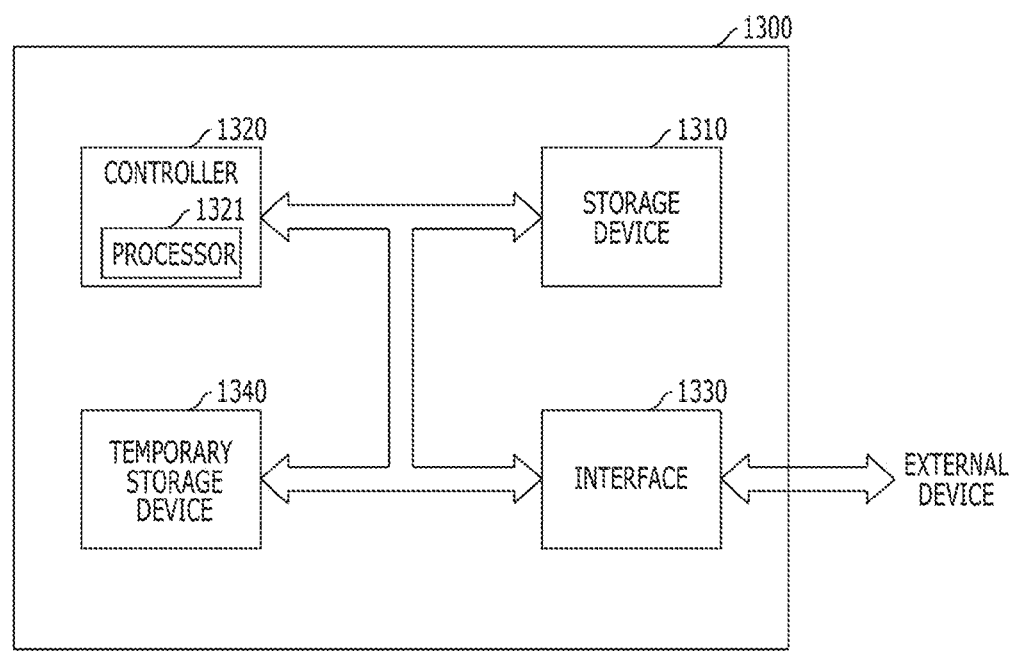
FIG. 10 is a configuration diagram illustrating an example of a data storage system which is implemented with a memory device in accordance with an embodiment.

FIG. 10 is a configuration diagram illustrating an example of a data storage system which is implemented with a memory device in accordance with an embodiment.

Referring to FIG. 10, a data storage system 1300 may include a storage device 1310 for storing data and having a non-volatile characteristic, a controller 1320 for controlling the storage device, an interface 1330 for coupling to an external device and a temporary storage device 1340 for temporarily storing data. The data storage system 1300 may be a disk type such as a hard disk drive (HDD), a compact disc read only memory (CDROM), a digital versatile disc (DVD), a solid state disk (SSD) and so on, and be a card type such as an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The storage device 1310 may include a non-volatile memory which semi-permanently stores data. The non-volatile memory may include a read only memory (ROM), a NOR flash memory, a NAND flash memory, a phase change random access memory (PRAM), a resistive random access memory (RRAM), magnetic random access memory (MRAM) and so on.

The controller 1320 may control exchange of data between the storage device 1310 and the interface 1330. The controller 1320 may include a processor 1321 which performs an operation and so on for processing commands which are input through the interface 1330 from the outside of the data storage system 1300.

The interface 1330 may exchange a command, data and so on between the data storage system 1300 and the external device. When the data storage system 1300 may be the card type, the interface 1330 may be compatible with interfaces which are used in a device such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. When the data storage system 1300 may be the disk type, the interface 1330 may be compatible with the interfaces such as an integrated device electronics (IDE), a serial advanced technology attachment (SATA), a small computer system interface (SCSI), an external SATA (eSATA), a personal computer memory card international association (PCMCIA), an universal serial bus (USB) and so on, or be compatible with interfaces which are used in the device similar thereto. The interface 1330 may be compatible with one or more interfaces which have different types.

The temporary storage device 1340 may temporarily store data to efficiently transfer the data between the interface 1330 and the storage device 1310 according to diversification and high performance of an interface with the external device, the controller, the system. The temporary storage device 1340 may include one or more of the embodiments of the memory devices as described above. For example, the temporary storage device 1340 may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix. Through this, an operation speed of the temporary storage device 1340 may be increased and a power consumption of the temporary storage device 1340 may be reduced. Consequently, a performance of the data storage system 1300 may be improved and a power consumption of the data storage system 1300 may be reduced.

Figure 11:
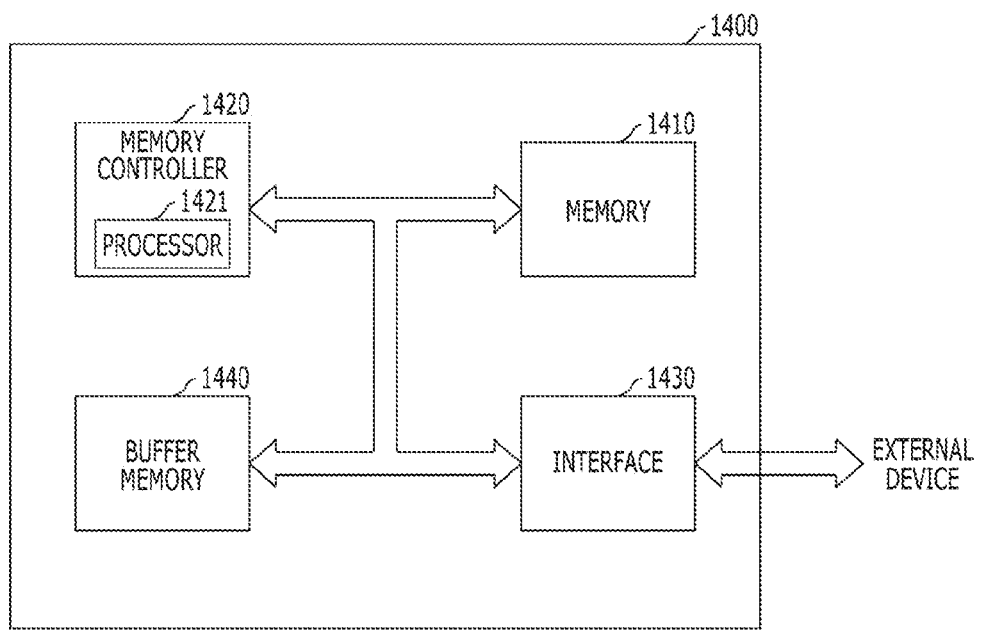
FIG. 11 is a configuration diagram illustrating an example of a memory system which is implemented with a memory device in accordance with an embodiment.

FIG. 11 is a configuration diagram illustrating an example of a memory system which is implemented with a memory device in accordance with an embodiment.

Referring to FIG. 11, a memory system 1400 may include a memory 1410 for storing data and having a non-volatile characteristic, a memory controller 1420 for controlling the memory, and an interface 1430 for coupling to an external device. The memory system 1400 may be a card type such as a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The memory 1410 may include one or more of the embodiments of the memory devices as described above. For example, the memory 1410 may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix. Through this, an operation speed of the memory 1410 may be increased and a power consumption of the memory 1410 may be reduced. Consequently, a performance of the memory system 1400 may be improved and a power consumption of the memory system 1400 may be reduced.

The memory may include a read only memory (ROM), a NOR flash memory, a NAND flash memory, a phase change random access memory (PRAM), a resistive random access memory (RRAM), a magnetic random access memory (MRAM) and so on having a non-volatile characteristic.

The memory controller 1420 may control exchange of data between the memory 1410 and the interface 1430. The memory controller 1420 may include a processor 1421 which performs an operation and so on for processing commands which are input through the interface 1430 from the outside of the memory system 1400.

The interface 1430 may exchange a command, data and so on between the memory system 1400 and the external device. The interface 1430 may be compatible with interfaces which are used in a device such as such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. The interface 1430 may be compatible with one or more interfaces which have different types.

The memory system 1400 may further include a buffer memory 1440 to efficiently transfer an input and an output of the data between the interface 1430 and the memory 1410 according to diversification and high performance of an interface with the external device, the memory controller, the memory system. The buffer memory 1440 which temporarily stores data may include one or more of the embodiments of the memory devices as described above. For example, The buffer memory 1440 may include a global line pair including a global bit line and a global source line; a plurality of cell matrices coupled between the global bit line and the global source line, each cell matrix including a plurality of local line pairs and a plurality of storage cells that are coupled to the plurality of local line pairs, wherein each storage cell is operable to store data and is coupled between local lines of a corresponding local line pair; and a plurality of isolation switch pairs that couple the plurality of cell matrices to the global bit line and the global source line of the global line pair, one isolation switch pair per cell matrix. Through this, an operation speed of the memory 1410 may be increased and a power consumption of the memory 1410 may be reduced. Consequently, a performance of the memory system 1400 may be improved and a power consumption of the memory system 1400 may be reduced.

The buffer memory 1440 may include a static random access memory (SRAM) and a dynamic random access memory (DRAM) having a volatile characteristic, and include a read only memory (ROM), a NOR Flash Memory, a NAND Flash Memory, a phase change random access memory (PRAM), a resistive random access memory (RRAM), a spin transfer torque random access memory (STTRAM), a magnetic random access memory (MRAM) and so on having a non-volatile characteristic. On the other hand, the buffer memory 1440 may not include the embodiment of the memory devices as described above, and may include the static random access memory (SRAM), the dynamic random access memory (DRAM) having the volatile characteristic, and include the read only memory (ROM), the NOR Flash Memory, the NAND Flash Memory, the phase change random access memory (PRAM), the resistive random access memory (RRAM), the spin transfer torque random access memory (STTRAM), the magnetic random access memory (MRAM) and so on having the non-volatile characteristic.

The characteristic of the electronic device or system in FIGS. 8 to 11 may be implemented with various devices, a system, or an application. For example, a mobile phone or other portable communication device, a tablet computer, a notebook or laptop computer, a game machine, a smart TV set, a TV set-top box, a multi media server, a digital camera having a wired and wireless communication function, a wristwatch or other wearing device having a wireless communication function.

What is claimed is:

1. An electronic device comprising
a semiconductor memory which comprises:
   a global line pair including a global bit line and a global source line;
   a plurality of cell matrices coupled between the global bit line and the global source line, each cell matrix including a plurality of common node pairs, a plurality of local selection switch pairs, a plurality of local line pairs and a plurality of storage cells that are coupled to the plurality of local line pairs, wherein each storage cell is operable to store data and is coupled between local lines of a corresponding local line pair, wherein a first local selection switch of the plurality of local selection switch pairs is coupled between a first common node of the plurality of common node pairs and a first local line, and a second local selection switch of the plurality of local selection switch pairs is coupled between a second common node of the plurality of common node pairs and a second local line; and
   a plurality of isolation switch pairs that couple the first common node and the second common node of the plurality of common node pairs to the global bit line and the global source line of the global line pair, respectively.

2. The electronic device according to claim 1, wherein the semiconductor memory is operable to control the isolation switch pairs to a cell matrix so that the plurality of the local line pairs of the selected cell matrix are floating while and the plurality of the local line pairs of a unselected cell matrix are driven at a ground voltage.

3. The electronic device according to claim 1, wherein each of the plurality of the cell matrices further includes:
   one or more discharge switch pairs that are coupled to the corresponding local line pair among the plurality of the local line pairs.

4. The electronic device according to claim 3, wherein the semiconductor memory is operable to turn off the one or more discharge switch pairs of a cell matrix to make the corresponding local line pair floating, when the corresponding cell matrix among the plurality of the cell matrices is a selected cell matrix, and
   when the corresponding cell matrix among the plurality of the cell matrices is an unselected cell matrix, the one or more discharge switch pairs are turned on to drive the corresponding local line pair at the ground voltage.

5. The electronic device according to claim 1,
   wherein a first isolation switch of the plurality of isolation switch pairs is disposed between the first common node of the plurality of common node pairs and the global bit line, and a second isolation switch of the plurality of isolation switch pairs is disposed between the second common node of the plurality of common node pairs and the global source line.

6. The electronic device according to claim 1, wherein each storage cell includes a variable resistance element that exhibits different resistance states for storing data and includes a magnetic tunnel junction.

7. The electronic device according to claim 1, wherein the semiconductor memory further comprises:
   a global line driver that is coupled to the global line pair and drives the global line pair with a predetermined voltage during a read operation or a write operation.

8. The electronic device according to claim 1, wherein each of the resistive storage cells includes:
   a selection unit; and
   a variable resistance element whose resistance value is decided based on a data stored in the resistive storage cell.

9. The electronic device according to claim 8, wherein the variable resistance element includes a phase change variable resistance element.

10. The electronic device of claim 1, further comprising a microprocessor,
   wherein the microprocessor comprising:
   an access control unit suitable for receiving a signal having a command from an outside of the microprocessor, extracting or decoding the command, or performing input/output control of the signal of the microprocessor;

an operation unit suitable for performing an operation according to a decoding result of the command in the access control unit; and a storage unit suitable for storing data to be operated, data corresponding to an operation result, or an address of the data to be operated, and wherein the semiconductor memory is a part of the storage unit within the microprocessor.

11. The electronic device of claim 1, further comprising a processor, wherein the processor comprising:

a core unit suitable for performing an operation corresponding to a command using data according to the command input from an outside of the processor; a cache memory unit suitable for storing data to be operated, data corresponding to an operation result, or an address of the data to be operated; and a bus interface which is coupled between the core unit and the cache memory unit, and transfers data between the core unit and the cache memory unit, and wherein the semiconductor memory is a part of the cache memory unit within the processor.

12. The electronic device of claim 1, further comprising a processing system, and wherein the processing system comprising:

a processor suitable for interpreting a received command, and controlling an operation of information according to an interpreting result of the command;

an auxiliary memory device suitable for storing a program for interpreting the command and the information;

a main memory device suitable for importing and storing the program and the information from the auxiliary memory device such that the processor performs the operation using the program and the information when the program is executed; and an interface device suitable for performing communication between one or more of the processor, the auxiliary memory device and the main memory device and an outside, and wherein the semiconductor memory is a part of the auxiliary memory device or the main memory device within the processing system.

13. The electronic device of claim 1, further comprising a data storage system, wherein the data storage system comprising:

a storage device suitable for storing data and retaining the stored data regardless of a power supply;

a controller suitable for controlling data input/output of the storage device according to a command input from an outside;

a temporary storage device suitable for temporarily storing the data which is exchanged between the storage device and the outside; and an interface suitable for performing communication between one or more of the storage device, the controller and the temporary storage device and the outside, and wherein the semiconductor memory is a part of the storage device or the temporary storage device within the data storage system.

14. The electronic device of claim 1, further comprising a memory system, wherein the memory system comprising:

a memory suitable for storing data and retaining the stored data regardless of a power supply;

a memory controller suitable for controlling data input/output of the memory according to a command input from an outside;

a buffer memory suitable for buffering the data which is exchanged between the memory and the outside; and an interface suitable for performing communication between one or more of the memory, the memory controller and the buffer memory and the outside, and wherein, the semiconductor memory is a part of the memory or the buffer memory within the memory system.

15. The electronic device of claim 1, wherein each of the plurality of cell matrices corresponds to each of the plurality of isolation switch pairs at one to one ratio.

* * * * *